(12) United States Patent
Karabatsos

(10) Patent No.: US 7,498,887 B1
(45) Date of Patent: Mar. 3, 2009

(54) HIGH FREQUENCY DIGITAL OSCILLATOR-ON-DEMAND WITH SYNCHRONIZATION

(76) Inventor: Chris Karabatsos, 42 Jumping Brook La., Kingston, NY (US) 12401

( * ) Notice: Subject to any disclaimer, the term of this patent is extended or adjusted under 35 U.S.C. 154(b) by 0 days.

(21) Appl. No.: 11/843,267

(22) Filed: Aug. 22, 2007

Related U.S. Application Data

(63) Continuation of application No. 11/308,518, filed on Mar. 31, 2006, now Pat. No. 7,276,982.

(51) Int. Cl.
*H03L 7/181* (2006.01)
(52) U.S. Cl. .............................. 331/16; 331/25; 331/57
(58) Field of Classification Search ................. 331/16, 331/25, 57
See application file for complete search history.

(56) References Cited

U.S. PATENT DOCUMENTS 6,075,415 A * 6/2000 Milton et al. ................. 331/25
6,608,530 B1 * 8/2003 Green et al. ................. 331/25

* cited by examiner

*Primary Examiner*—Robert Pascal
*Assistant Examiner*—James E Goodley
(74) *Attorney, Agent, or Firm*—Mark P. White

(57) ABSTRACT

A High Frequency Digital Oscillator contains a ring oscillator having an output fn, and having coarse and fine frequency adjustments, wherein the input signal f1 is the input to both the ring oscillator and the High-Frequency Digital Oscillator, which has a multiplicity of output signals including f2, f4, and f8 at one-half, one fourth, and one-eighth the frequency of fn respectively, and wherein an input gating signal causes the oscillator to start or stop, a signal $fc = \frac{1}{4} \ast (f4)$ causing a coarse frequency adjustment and a signal $\Delta = (1/f1 - 1/fc)$ making a fine adjustment, and by stopping the new output before the rising edge of f1; and then restarting starting the new output at the rising edge of so that the output and input are synchronized.

5 Claims, 20 Drawing Sheets

RING OSCILLATOR

LOGIC SMBOLS

A = AND
N = INVERT
O = OR
⊠ = PASS GATE
▷ = Lo Level
—— = Hi Level

GATED RING OSCILLATOR with DELAY or LOAD

NOTE 1: A wedge at the output or at the input of a logic block indicates a low logic signal level. A line without a wedge indicates a Hi signal logic level.

NOTE 2: A letter within the logic block indicates the function of the block

HIGH FREQUENCY DIGITAL OSCILLATOR-ON-DEMAND WITH SYNCHRONIZATION

PROSECUTION HISTORY

This application claims priority based on U.S. patent application Ser. No. 11/308,518 filed on Mar. 31, 2006 for "High Speed Digital Oscillator-on-Demand with Synchronization", on Provisional Patent 60/666,603 filed on Mar. 31, 2005, for "High Speed Digital Oscillator-on-Demand with Synchronization", and also on Provisional Patent 60/670,618 filed on Apr. 13, 2005, for "I/O Output to Clock Edge Synchronization".

PRIOR ART

Frequencies required for all kinds of applications, usually, are synthesized through multiplication techniques from an external lower-frequency controlled source or from an internal base oscillator. The internal oscillator is normally an analog type Voltage Controlled Oscillator (VCO). As the name implies, its frequency is controlled by voltage that is derived from comparators and amplifiers. The theories of VCO's have been very extensively described and defined throughout the years. The main frequency of a VCO is much higher than that required by the application.

The application frequencies are derived through division methods from the VCO. The VCO has the ability to synchronize with an incoming signal by means of a phase comparator derived voltage level. As it is very well known, the synchronization takes a considerable amount of time, and as a result the VCO cannot be gated and cannot supply the required frequencies on demand without a significant time delay. In some cases, many cycles are required before the oscillator reaches stability and synchronization with the incoming signal. In addition, the VCO produces jitter as it tries to synchronize with phase changes in the incoming signal. This Jitter is also a result of variations in the power supply. The circuitry, which is analog, will furthermore consume excessive power as the output oscillates before reaching stability.

In other applications, where the frequency of the logic circuitry has to synchronize with an externally supplied clock frequency, Phase Locked Loop (PLL) and Delay Locked Loop (DLL) circuitry is used in either discrete logic or in an imbedded logic hardware. Since PLL and DLL circuitry is generally based on VCO and phase comparator designs, excessive power is consumed. Furthermore these prior art circuits will not produce instant synchronization.

A system and an apparatus to produce a digital clock oscillator of high frequency and derive lower frequency clocks by digital division of the high frequency are essential for many modern circuitry applications. Such an apparatus will have the ability to start and stop oscillating, almost instantaneously, by means of a control signal. In doing so, it must remain synchronized to an external control signal or clock.

Such a circuit is the subject of the current invention which is described herein

SUMMARY OF THE INVENTION

It is an object of the present invention to provide an oscillator circuit which can be turned on and off within a single period of the output signal. It is a further object of the invention to produce output signals which are twice, four times, and other multiples of an input signal.

In accordance with a first aspect of the present invention, a high frequency digital oscillator includes a ring oscillator having an output fn whose frequency is controlled by coarse and fine frequency adjustments.

In accordance with a second aspect of the invention an input signal f1 is connected to an input to the ring oscillator.

In accordance with a third aspect of the invention number of additional output signals f2, f4, and f8 are produced, having frequencies fn/2, fn/4 and fn/8, respectively, and which are synchronized with output signal fn.

In accordance with a fourth aspect of the invention an input gating signal causes the oscillator to start or stop.

In accordance with a fifth aspect of the invention means are provided for measuring the period p1=1/f1 of signal f1.

In accordance with a sixth aspect of the invention means for generating signal fc having a frequency equal to fn/4;

In accordance with a seventh aspect of the invention means are provided for making a coarse adjustment to the ring oscillator as a function of measured results of the period p1;

In accordance with an eighth aspect of the invention means are provided for measuring the time interval $\Delta=(1/f1)-(1/fc)$.

In accordance with a ninth aspect of the invention means are provided for making a fine adjustment to the output frequency, thereby generating a new signal (new fn) whose frequency is a function of time interval $\Delta$.

In accordance with a tenth aspect of the invention means are provided for generating output signal f0 whose frequency is calculated as ¼*(new fn).

In accordance with an eleventh aspect of the invention means are provided for stopping signal f0 and signal (new fn) before the rising edge of signal f1; and means are provided for starting signal f0 and signal (new fn) at the next rising edge of signal f1.

According to a twelfth aspect of the invention the final signal f0 has the same frequency as signal f1, and is in synch with f1.

According to a final aspect of the invention, signal f2 is one-half the frequency of signal new fn, and signal f4 has a frequency equals to f0, which has a frequency equal to one-fourth the frequency of signal (new fn).

BRIEF DESCRIPTION OF THE DRAWINGS

These, and further features of the invention, may be better understood with reference to the accompanying specification and drawings depicting the preferred embodiment, in which.

BRIEF DESCRIPTION OF THE INVENTION

Figure 1:
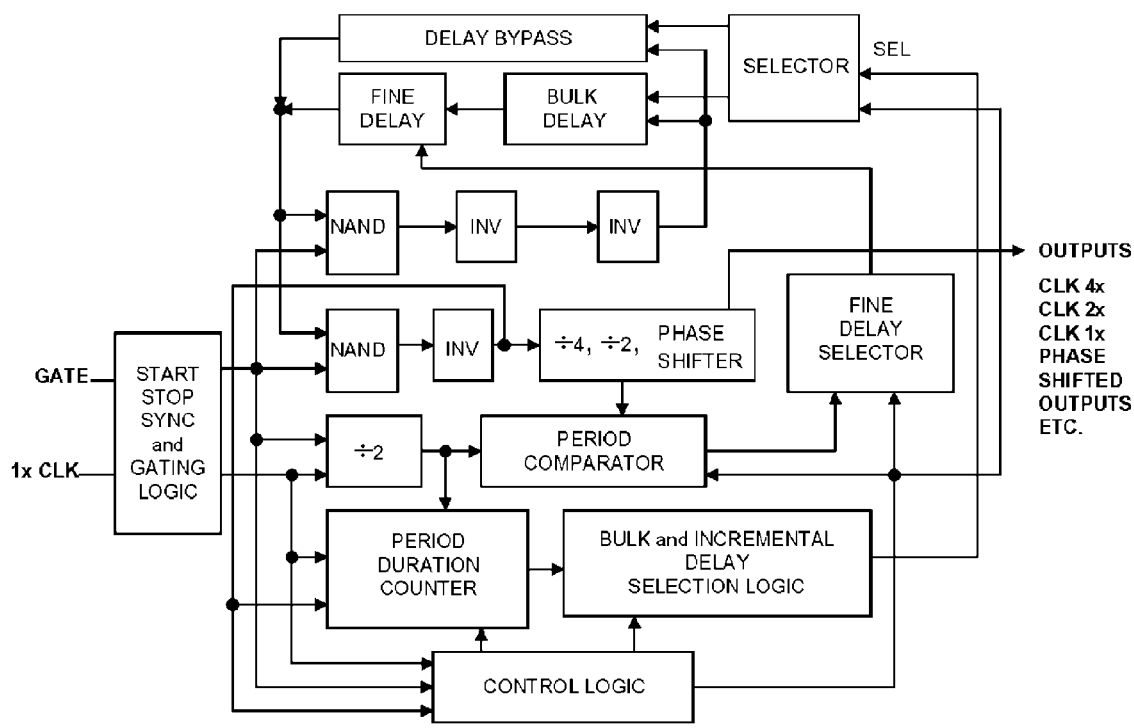
FIG. 1 depicts a block diagram of the digital ring oscillator and associated controls to produce the desired frequencies.

An "Oscillator-on-Demand" is, by definition, an oscillator which does not oscillate until it is gated to start. The detailed description of the invention defines how the oscillator is constructed and how it will operate on demand along with a method of synchronization with an external clock source.

This invention relates to methods and to the apparatus in which a gated ring oscillator is constructed in silicon and controlled to provide a base clock frequency multiple times higher than the frequency of an applied clock signal. The multiplication factor in this device is a power of 2 times that of the clock signal.

Such a ring oscillator has the ability to be turned On and Off without generating a time delay before synchronization to the control signal is effected.

This circuit has the ability to provide multiple clock frequencies derived from the base ring frequency and to further provide a plurality of multiply phase shifted clocks, while maintaining a synchronized relationship to the incoming control clock.

The ring oscillator frequency is adjustable to cover a range of frequencies based on the frequency of the controlling clock. The ring oscillator reproduces the period of the controlling incoming clock and maintains a good synchronization therewith. It uses neither the customary Voltage Control Oscillator nor the Delay Locked Loop methods.

The designed base frequency is altered by circuit delays, based on the inherent delays of the silicon hardware, providing an adjustment to the required clock frequency. It uses methods of measuring the duration of signals and translates those to circuit delays for frequency adjustment.

Signal variations resulting from variations in the silicon circuitry, voltage and temperature are better controlled and compensated using the present invention that in any of the prior art circuits.

Once the final delays have been selected and the final frequency is established, those values are preserved as long as power continues to be applied to the circuits. They may also be saved in a Flash type device to be re-applied whenever the power is reapplied.

After the delays are selected and the frequency is adjusted, the rising edge of the controlling incoming clock will produce the first rising edge of the ring oscillator, thus maintaining good synchronization with the input clock signal.

During the initial power-on time, the amount of the delay and selection of the delay to adjust the ring frequency will require two to three incoming clock periods.

During initial power-up time of a system, many initialization processes must be completed before any useful work can take place. Therefore, there is no time lost by frequency adjustment of the ring.

All of the circuits for the oscillator of the present invention are digital in nature. In comparison, analog circuits consume much higher levels of power. As a result, the present invention provides an appreciable saving in power consumption than the circuits of the prior art.

DETAILED DESCRIPTION OF THE INVENTION

A digital approach not requiring either a Voltage-Controlled Oscillator or a Delay-Locked Loop will be described herein.

Figure 1A:
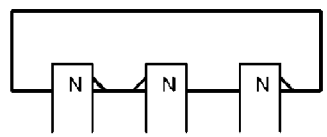
FIG. 1a depicts an arrangement of digital circuits that comprise a basic free running ring oscillator.

As is well know in the prior art, if an odd number of digital inverter circuits are connected in a loop arrangement, the loop will oscillate as long as there is power to the circuits. Such an arrangement is known as a ring oscillator and is shown in FIG. 1a. The oscillator pulses produced by the ring oscillator will be very symmetrical. The frequency produced will depend on the total delay of the inverter circuits and the delay that may be applied at any point in the loop as a series delay 101 or as a load delay 102 as shown in FIG. 1b.

The latest developments in silicon technology have produced very small gate delays. It is not unusual to have inverter circuits in the very small pico-second range, typically 20 to 50 picoseconds. Thus, the ring oscillator of FIG. 1a runs at very high frequency. But it and has no facility to start or stop oscillation other than applying and removing power to the digital inverters. In addition, if a load or a delay is applied at any point in the loop, the oscillator frequency will decrease depending on the amount of delay caused by the cumulative loading. These two drawbacks are remedied by the present invention.

Figure 1B:
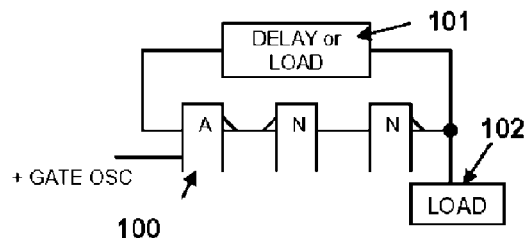
FIG. 1b depicts an arrangement of digital circuits that comprise a gated ring oscillator that includes a delay block inserted in the loop.

A variation of the ring oscillator with a gating signal is shown in FIG. 1b. One of the inverters is substituted by a NAND gate 100. One of the NAND inputs is attached to the loop and the other to a gating signal called GATE OSC. The loop delay is also controlled with the insertion in series of a fixed or adjustable delay element 101 or an attachment of a capacitive load 102 in the loop. If the GATE OSC signal is at Lo level, the loop will stop oscillating. If the gating signal is at Hi level, the loop will oscillate as long as there is power attached to the circuits.

Figure 1C:
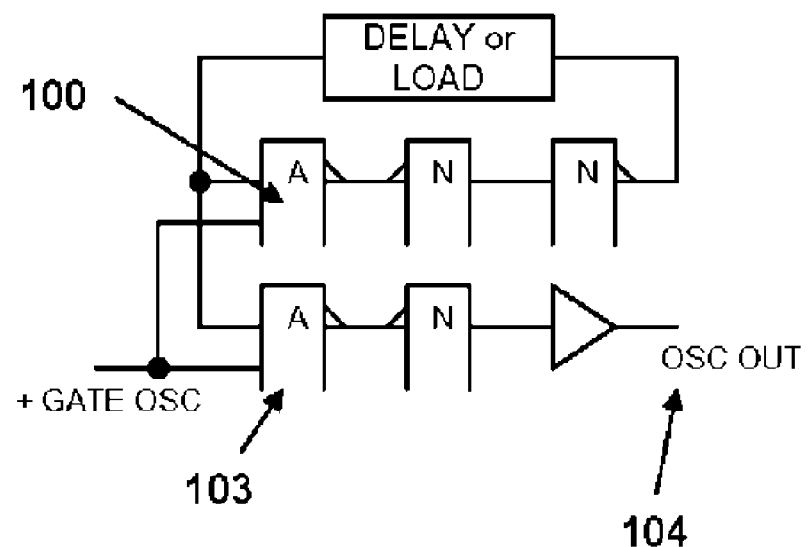
FIG. 1c depicts a gated ring oscillator with the delay inserted in the loop and with a gated oscillator output.

To avoid the loading effects to the loop, the output of the oscillator OSC OUT 104, shown in FIG. 1c, is derived by a separate NAND gate 103 attached to the same gating signal that gates the ring loop. The addition of the load to the loop by the added NAND gate 103 will slow the oscillator slightly. The phase of the signal OSC OUT 104 is selected by the logic gates that produce it.

If a 50 pico-second delay per gate is assumed in the loop FIG. 1a, the pulse width will be 150 picoseconds and the ring frequency f will be 1/300 picoseconds or 3.333 . . . GHz. This is the highest frequency at which this loop can oscillate.

The GATE OSC signal FIG. 1c is used to turn the oscillator on and off. If the signal is Lo level, will stop the ring from oscillating. When it goes Hi, it will produce the OSC OUT signal with the first rising edge of the pulse in synchronized phase with the GATE OSC signal and within some delay. The phase delay of OSC OUT will be the delay of the gates, the driver delay and the delay caused by the load attached to it. As long as the GATE OSC signal stays Hi, the ring will continue to oscillate and will generate the OSC OUT frequency equal to the ring frequency. The ring frequency is adjusted by varying the loop delay.

Figure 2:
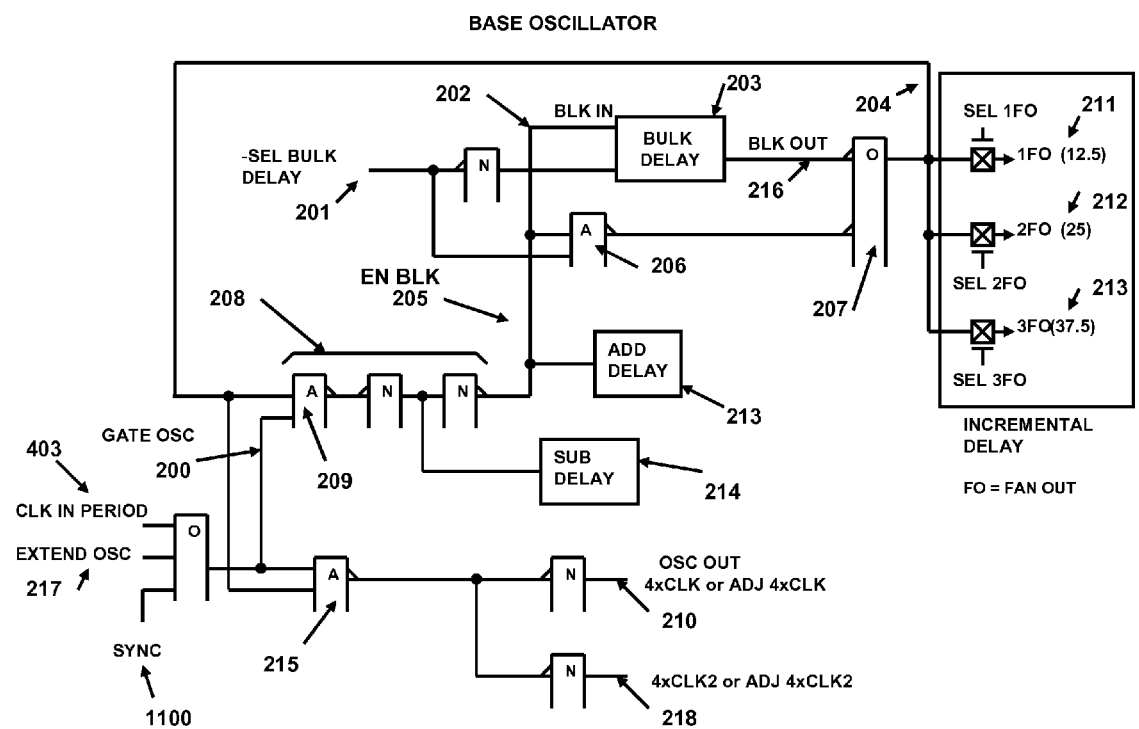
FIG. 2 depicts a more detailed drawing of the gated ring oscillator with delays and controls to implement them.

To further understand the operation of this circuit, reference is made to FIG. 2, the BASE OSCILLATOR. Referring now to this Figure, the oscillator is seen to include the base ring gates 208 with a gating signal 200. The base ring is constructed with the ability to add or subtract a delay time. The feedback loop consists of two paths. The first is through gate 206, through OR gate 207, connected by feedback 204 to the input of the NAND gate 209 of the ring. The other path is through the BULK DELAY 203, through OR gate 207, connected by feedback 204 to the input of the NAND gates 209 and 215. Selection of path 206 or 203 is accomplished by signal 201—SEL BULK DELAY.

To further explain the operation, the following example is described. Assume that the BULK delay 203 is bypassed and path 206 is selected. For this example, the Ring Oscillator 208 and the initial selected path along with the attached delays ADJ DELAY1 and ADJ DELAY2 and other loads is chosen to have a total loop delay of 300 picoseconds. The period of the oscillator, in this case, will be 600 picoseconds and the frequency of the ring will be 1/600 picoseconds or f=1.666 GHz. The signal, OSC OUT 210, will have the same frequency as the ring oscillator. Gate 215 taps off gate 209 inputs to reduce the loading effects to the oscillator ring.

The Hi level signal of the GATE OSC 200 allows the ring to oscillate. The GATE OSC 200 can be produced by any of the signals 403, 217 or 1100. These signal durations determines how long the oscillator will oscillate. To derive lower frequencies, the ring frequency is further divided digitally to obtain the desired clock frequencies and desirable phase shifts.

Figure 8:
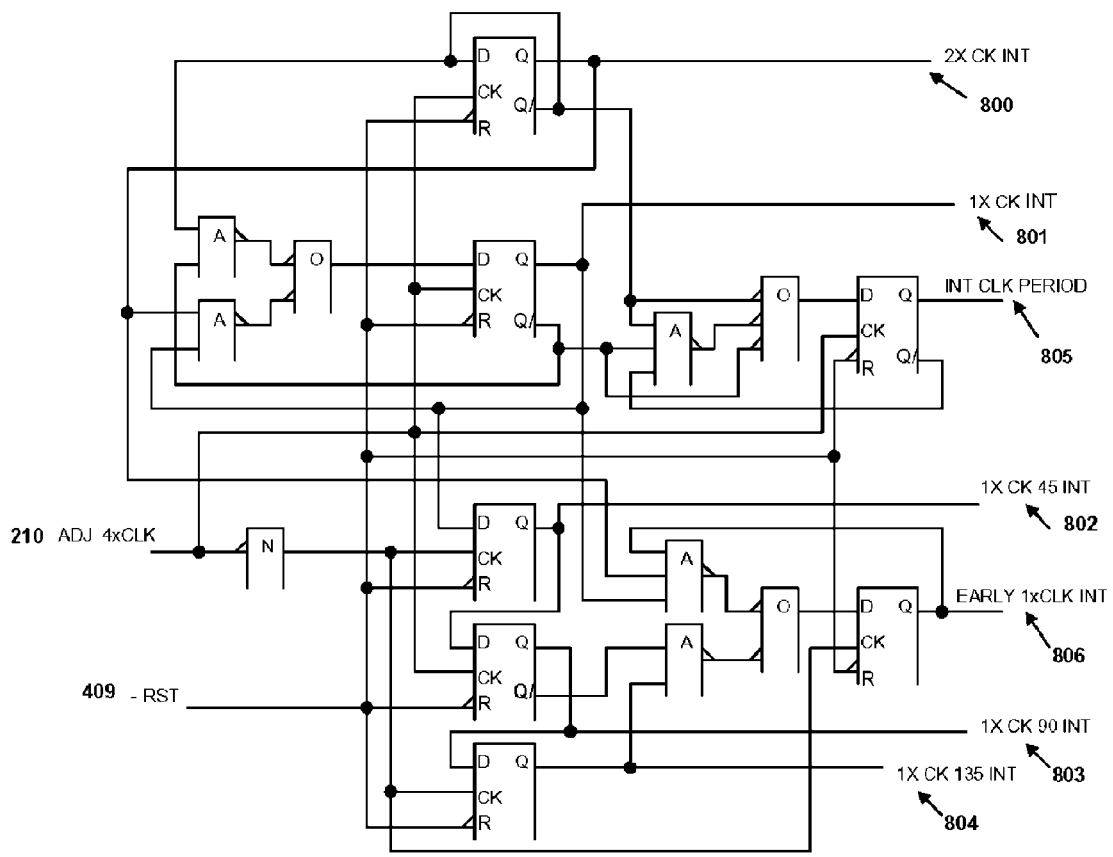
FIG. 8 depicts a base ring oscillator frequency divider and phase shifter circuit.
Figure 8A:
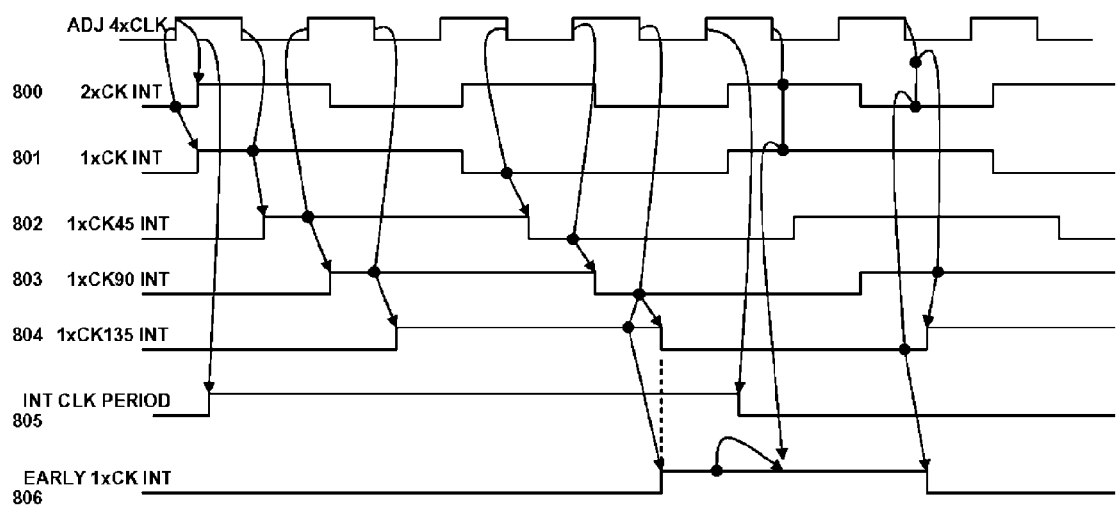
FIG. 8a A timing diagram of the derived signals from the design of FIG. 8.

Referring now to FIG. 8. A divider and phase shifter circuit is shown. The timing diagram of signals of this circuit is shown in FIG. 8a. It is assumed that the base frequency of the oscillator is ADJ 4×CLK 210 after the delay adjustment of the loop has taken place.

To be able to select any oscillator frequency within a range of frequencies established by the intended design, a BULK delay selection mechanism in path 203 is required along with selection of incremental delays. The BULK and incremental loop delays are partitioned in selectable increments to adjust the ring oscillator frequency.

Figure 3:
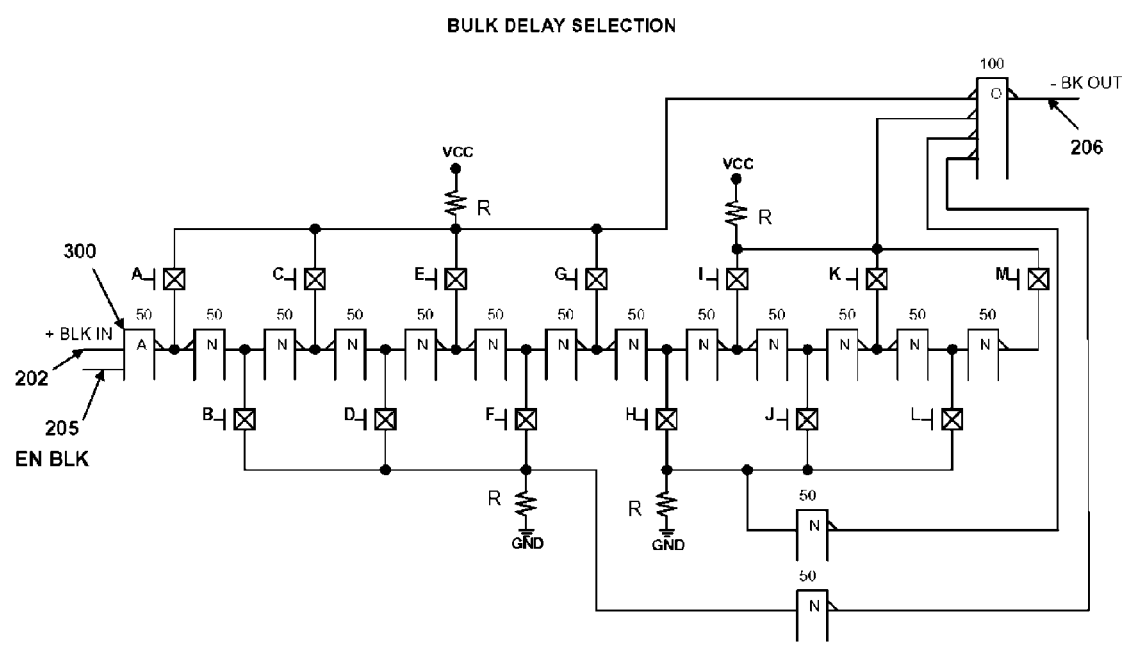
FIG. 3 depicts a BULK delay tree with selection taps and controls to enable them.

Referring next to FIG. 3, the bulk delay arrangement is shown, consisting of a series of selectable inverters. Selection can be made by any digital means without departing from the main aspect of the invention. A typical delay through each inverter will be assumed to be 50 pico-seconds. The output of each inverter stage will be selected by a PASS GATE, or similar means, and inserted in the loop through the OR gate. The entire bulk delay arrangement can be bypassed, and the delay eliminated, by disabling the NAND gate 300 of FIG. 3.

Initially the BULK delay 203 will be bypassed. Only the base loop 206 will be selected. As a typical implementation, the base loop period is 600 pico-seconds with a pulse width of 300 picoseconds. The maximum frequency of the base loop will be 1/600=1.666 GHz. The base loop frequency is designed, initially, at a value appropriate to measure the period the width of an incoming clock period.

Once the measurement is accomplished, the BULK delay 203 and or any of the adjustable delays, ADD DELAY 213 or SUB DELAY 214 is selected and inserted in the loop. At this point the frequency of the oscillator will be close to the desired base oscillator frequency from which all other required frequencies are derived. Further fine adjustments to this frequency will be made for more accuracy and synchronization.

It is desirable to have the base oscillator frequency be powers of 2 times the input frequency, or n×CLK IN frequency where (n=1248.). The highest frequency is chosen at design time. For the purpose of illustration, n=4 is chosen.

The base loop frequency, once selected and adjusted with the loop delay, will be divided by 4 to produce a frequency as close as possible to the incoming CLK IN frequency or 1 CLK 400. This is effected by a coarse adjustment of the ring oscillator. A fine adjustment of the ring oscillator is also provided.

Referring again to FIG. 2. the GATE OSC 200 signal starts the oscillator. The signal GATE OSC 200 is produced according to design requirements. A pulse of the GATE OSC 200 is selected to be the positive pulse of the incoming period CLK IN PERIOD 403. It is this positive pulse whose width duration is to be measured and determine what delay to use in the loop so that a division by 4 will give a clock period as close to the duration of the incoming CLK IN PERIOD 403. Measuring the period duration rather than the half period of the incoming clock is a more accurate way because it does not depend on duty cycle pulses of the period.

Method of Measuring Pulse Width Duration

Figure 5:
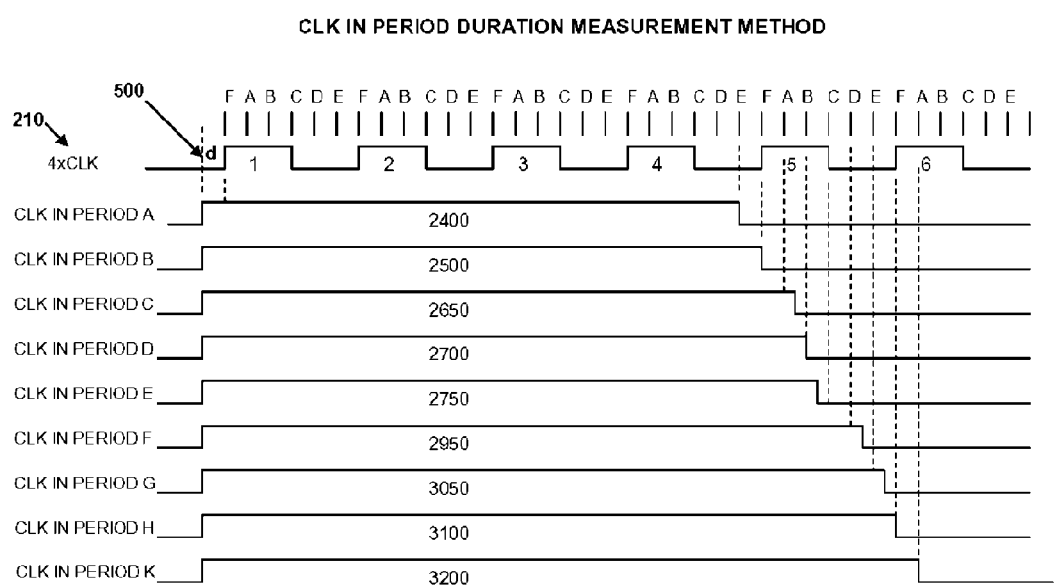
FIG. 5 depicts a timing diagram which shows the relationships of different clock frequencies with respect to the oscillator basic frequency.

To measure the duration of the pulse width of input frequency f1, the present system counts how many base oscillator (also called the "ring oscillator" periods and fractions of the period one can fit in the duration of one period of the incoming clock. Samples of typical signals are shown in FIG. 5.

The output signals are subject to a coarse frequency adjustment. That will be a coarse frequency adjustment. For the illustration we chose to have a range of incoming clock frequencies from 400 MHz and below. These frequencies will be referred to as 1×CLK frequencies. They are intended to be one quarter of the ring oscillator frequency once the loop delays are adjusted. The interest here is to have a 1×CLK internally derived frequency from division of the base oscillator in synchronization and as close as possible with the 1×CLK incoming clock. The base ring oscillator frequency with the loop delay adjusted will be referred to as the ADJ 4×CLK. A division by 4 will produce the internal 1×CLK. The period of the derived 1×CLK internal and the period of the incoming 1×CLK external will be further compared and the result will be used to adjust a fine loop delay.

Incoming Clock Period Duration Measurement

For this example the loop oscillator is designed to produce an output signal with a period of 600 picoseconds. In practice any frequency can be chosen as long as the silicon speed can support it and as long as latches and counters can be operated reliably at this output frequency. The oscillator pulse must be wide enough to clock a latch reliably. The initial base loop delay will have adjustable delay components to increase or decrease the base loop frequency before any BULK delay is applied to the loop. Circuitry is provided to control the base oscillator output frequency by inserting delays in the path of the feedback loop.

The following description includes:

means to measure duration of one of the incoming clock periods;

means to select the applicable BULK loop delay;

means to adjust the delay for the incremental duration non-accounted with the BULK loop delay;

means to refine the delay to get as close as possible to the incoming clock frequency; and means to synchronize the oscillator with every rising edge of the incoming clock period.

For the purposes of further explaining the operation of the present invention, assume the base non-adjusted ring oscillator runs 4 times as fast as the incoming clock. The circuitry first determines how many base clock periods of the unadjusted 4×CLK 210 one can fit in the CLK IN PERIOD 403 of the external 1×CLK 400. A 4 bit counter is implemented to be able to cover the frequency range chosen. If the base clock period is shorter than 600 picoseconds a counter larger that 4 bits may be required. Measurement of the incoming clock periods.

Figure 4:
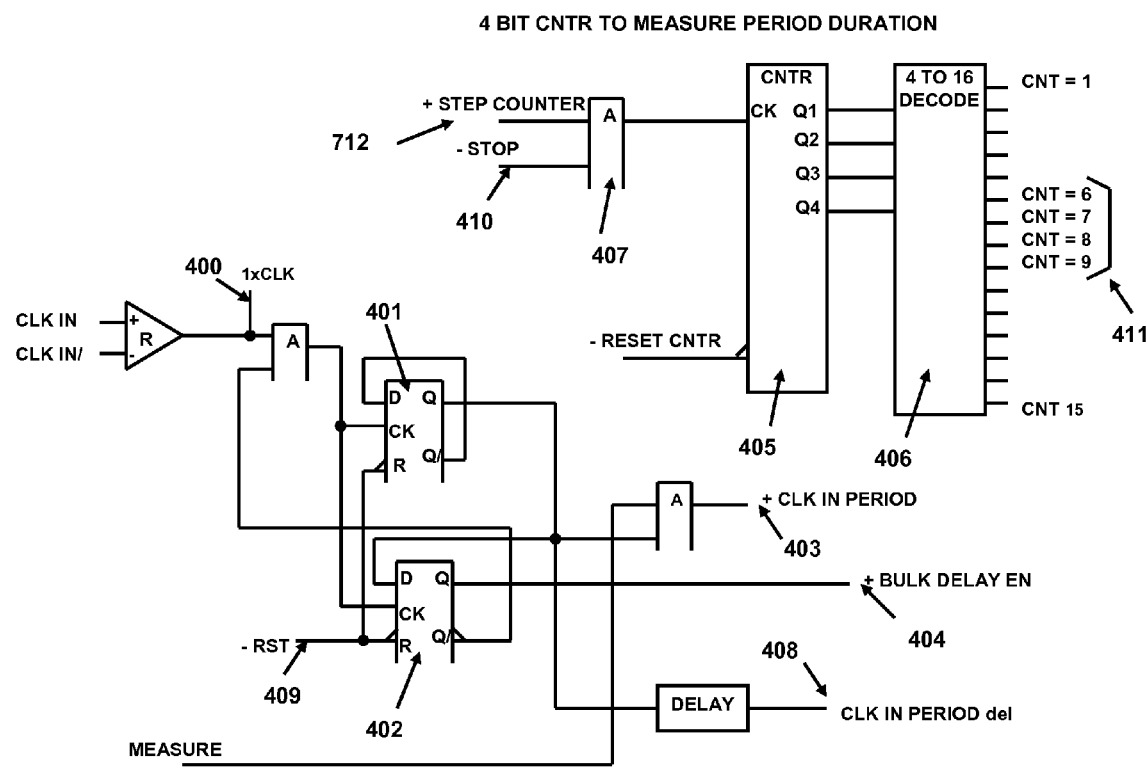
FIG. 4 depicts a digital design approach to generate an incoming clock period and a 4 bit counter to facilitate in determining the incoming clock period.
Figure 7:
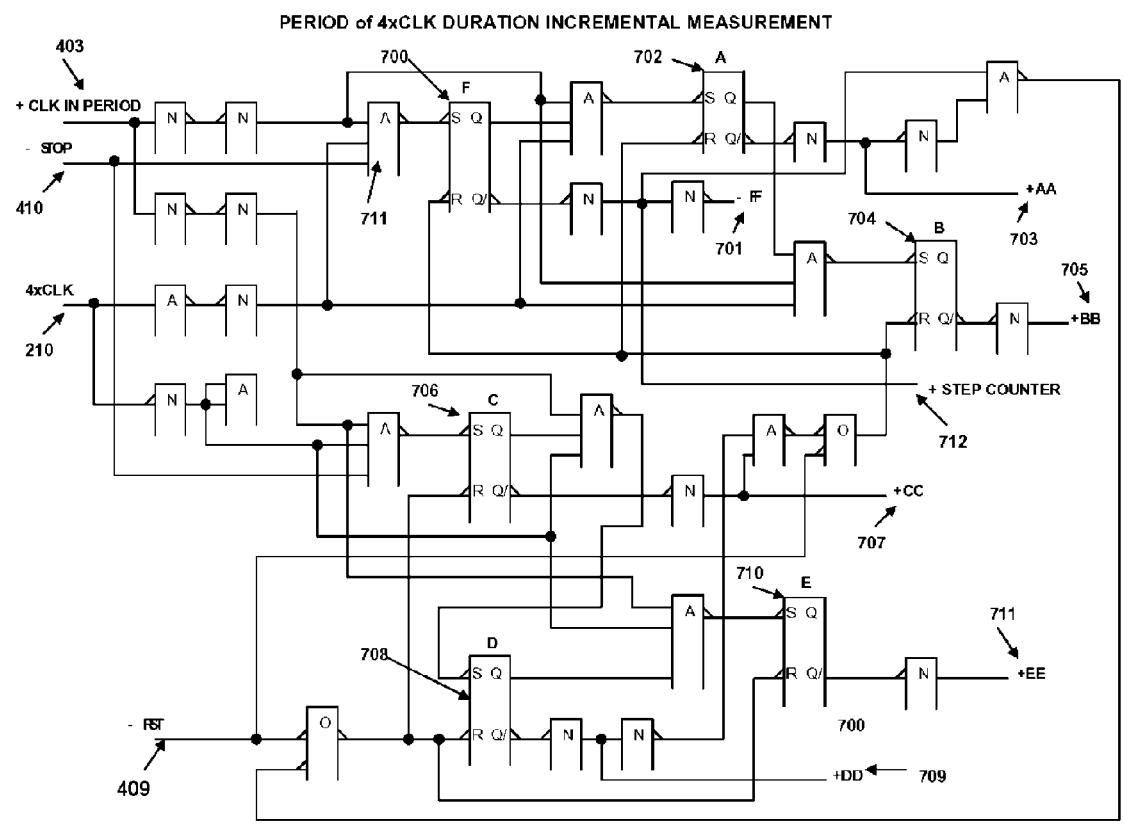
FIG. 7 depicts a collection of Set/Rest latches used to measure the duration of the base ring clock signal within the duration of one period of the incoming clock.

Referring now to FIG. 4, the period counter 405 is stepped with the rising edge of the STEP COUNTER signal 712 of FIG. 7. The STEP COUNTER signal is produced only if latch F 700 of FIG. 7 is set. This occurs always after every rising edge of the 4×CLK. The counter will count as long as the CLK IN PERIOD 403 is Hi and latch F 700 gets set. Latch F 700 will set if the AND 711 condition of the CLK IN PERIOD and the 4×CLK Hi pulse is wide enough to satisfy the set time of the latch. It will reset every time latch C 706 sets.

Figure 4A:
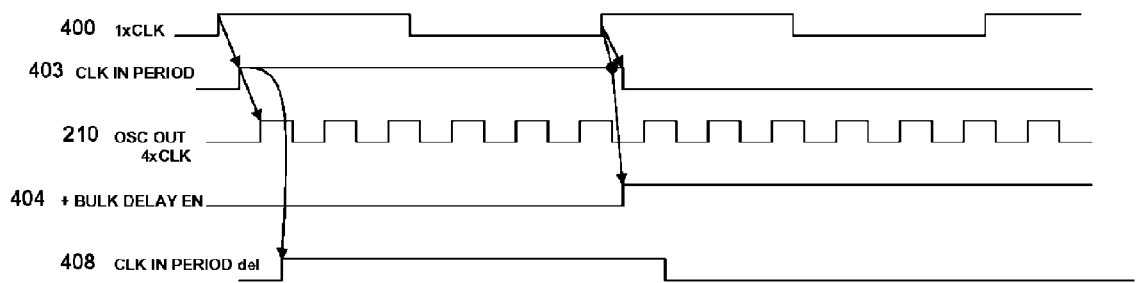
FIG. 4a depicts a timing diagram derived from the logic of FIG. 4, which shows the relationships between various signals.

Referring next to FIG. 4, after the RST expires, latches 401 402 and period counter 405 are set to the idle or reset state. The incoming 1×CLK 400 drives the divider latch 401 and the enable latch 402. The divider latch 401 produces the desired period pulse CLK IN PERIOD 403, which is shown in FIG. 4a. Latch 402, when set, allows selection process of the BULK delay. Other circuits may be employed to determine when and how the BULK delay is selected without departing from the current invention.

Latch 402 is reset with the RST signal 409. However, other methods for reset could be used to allow period measurements without departing from the current invention. CLK IN PERIOD 403 is fed to FIG. 2 to produce the signal GATE OSC 200 to start the oscillator. The signal GATE OSC 200 has to be extended to allow the completion of the period measurement and other delay selections. Once all of the variable parameters have been chosen, the values will be preserved as long as power is applied.

The first 4×CLK 210 rising edge always occurs after the CLK IN PERIOD 403 rising edge. This interval of time is shown as 500 in FIG. 5 and FIG. 6 and is assumed to be 100 picoseconds for the purpose of illustration. Other values could be used according to the deign implementation. The output of the period counter is decoded by a 4 to 16 decoder 406. The decoded count is part of the selector mechanism of the BULK delay value. Selection of the BULK delay is allowed only after CLK IN PERIOD 403 expires and proper logic decision time is established.

When pulse CLK IN PERIOD 403 terminates, the counter will stop from counting because there will be no further setting and resetting of latch F 700 of FIG. 7.

Referring now to FIG. 5. The base clock period of the unadjusted 4×CLK 210 is sub-divided into equal intervals. The rising edge of each period is designated by the letter F. The interval F is from the rising edge of the clock to the beginning of the interval designated with the letter A. The interval of time selected for the purposes of illustration was chosen to be 100 picoseconds. Therefore 6 intervals are produced since the chosen frequency of the base non-adjusted oscillator period is 600 picoseconds. The interval named F, A through E for every period of the 4×CLK is shown in FIG. 5 and in FIG. 6. The interval of 100 picoseconds is chosen so that an SR (Set Reset) latch can be reliably set. Representative SR latches 601 and 602 are shown in FIG. 6.

Figure 6:
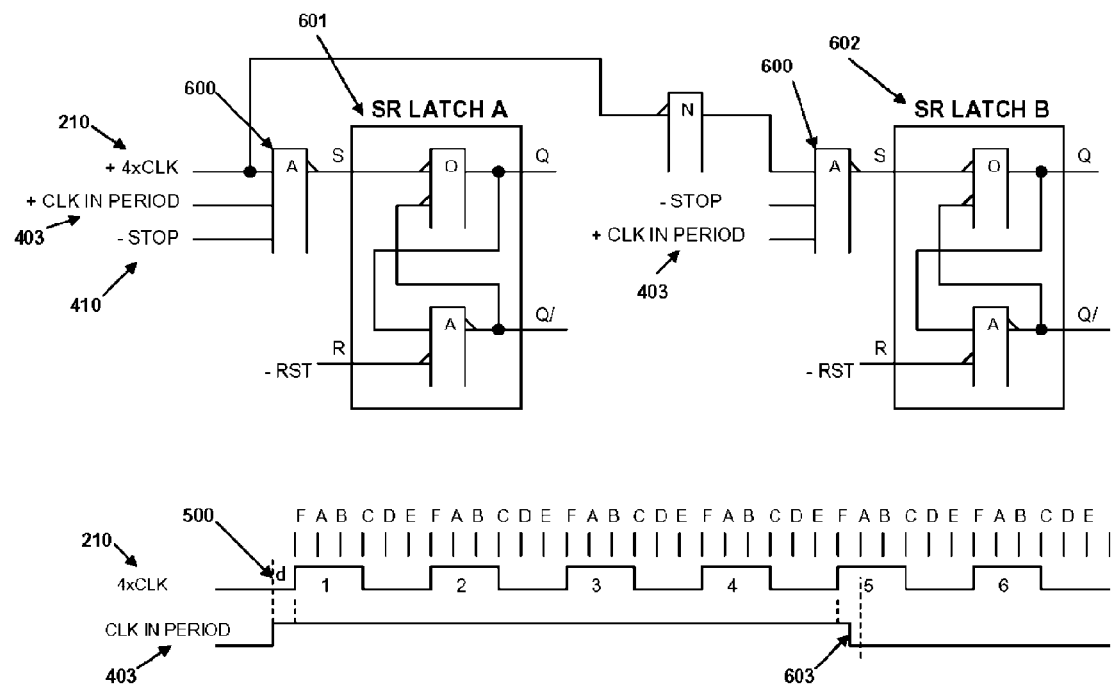
FIG. 6 depicts a pair of Set/Reset latches, showing the relationship between the input signal to the latches and the ring frequency signal.

Referring now to FIG. 6, two SR latches 601 and 602 are shown. The setting of the latch is the Lo signal of the output of the NAND gate 600. Assuming that the STOP signal 410 is not active, the setting of the latch is determined by the state of signals 4×CLK 210 and CLK IN PERIOD 403. The timing relationship of these signals is shown in FIG. 6. CLK IN PERIOD 403 is the signal to be measured. Signal 4×CLK 210 is the base clock which appears in FIG. 2 before any BULK and incremental delays have been selected and applied. In this case, the period of the 4×CLK is assumed to be 600 picoseconds by design. Latch 601 is set only with the Hi pulse of the 4×CLK period, while latch 602 is set during the Lo pulse of the 4×CLK period.

Three latches are required for the Hi pulse and three for the Lo pulse of the 4×CLK. Those latches are shown in FIG. 7 and are named F 700, A 702 and B 704 for the Hi pulse and C 706, D 708 and E 710 for the Lo pulse. Whenever latch F 700 is set, a reset signal is applied to the latches C, D and E. The reset is removed when the A latch is set. Whenever latch C is set, a reset signal is applied to the latches F, A and B. The reset is removed when the D latch is set.

With every period of the 4×CLK under the valid Hi time of the CLK IN PERIOD, all latches of FIG. 7 are set and reset accordingly. Eventually, the trailing edge 603 of the CLK IN PERIOD signal will occur within some point of the period of the 4×CLK. Only some latches will stay set when that happens. The last latch to set will be determined by the time overlap of the 4×CLK Hi or Lo pulse and the end of the CLK IN PERIOD signal. At this point, a STOP signal 410 could be applied to inhibit further latch alterations. When the stopped stage is reached, a decoding of the period counter 405 and of the incremental latches of FIG. 7 will take place and the total BULK and incremental delay value will be selected from the delay string of FIG. 3 and FIG. 2 accordingly and will be inserted in the loop of the gated oscillator.

There is a required time from the input to the NAND gate 600 until the latch 601 or 602 is set. This time is determined by the speed of the CMOS process technology used for the implementation of the logic. For the purposes of illustration, it is assumed 100 picoseconds nominal pulse width is required to set the latch reliably. This means that if, for example, the CLK IN PERIOD trailing edge occurs 100 or more and less than 200 picoseconds past the rising edge F of the 4×CLK, only latch F 700 of FIG. 7 will be set. Therefore, the CLK IN PERIOD could extend 0 to 99 picoseconds past the 100 picoseconds required duration to set latch F 700 without affecting the next latch. The same applies for all other latches of FIG. 7.

The incremental latches as shown in FIG. 7 will be set and reset during each 4×CLK 210 period provided that the period is overlapped by the CLK IN PERIOD 403. When the period ends, the latches that remain set will be frozen in that state and will be decoded.

Based on the period counter decoded value by decoder 406 and based on which latch was the last to be set, the appropriate BULK and incremental delay from the delay trees will be selected to be added to the loop.

Once the BULK and the incremental delays are set, they will remain set until the decision is made to go through the selection again. In addition to the selected delays as described, there is one more determination to be made about fine delay adjustment. During the incremental latch setting in FIG. 7, the CLK IN PERIOD 403 to be measured may have a range of ending times past the last latch to be set. This time is between 0 and 99 picoseconds for the illustration numbers chosen for clock period and incremental intervals.

Referring next to FIG. 6, the CLK IN PERIOD 403 shown in the timing diagram starts 100 picoseconds before the rising edge of the first 4×CLK 210 pulse. It ends past period #5 but does not satisfy the time required to set the latch F 700 of the next period.

Referring again to FIG. 5, several CLK IN PERIOD signals with their trailing edge are shown. Assuming a CLK IN PERIOD of 3100 picoseconds, and assuming that the base unadjusted ring oscillator has a period of 600 picoseconds, the period counter at the end of the period duration will have a count of 5 and the incremental latch E 710 of FIG. 7 set. Latch E 710 represents 600+ picoseconds.

For the purpose of illustration, each incremental latch of FIG. 7 has a weight (value) of 100 picoseconds, and the following parameters are also assumed:
Weight of Latch F=100 picoseconds
Weight of Latch A=200 picoseconds
Weight of Latch B=300 picoseconds
Weight of Latch C=400 picoseconds
Weight of Latch D=500 picoseconds
Weight of Latch E=600 picoseconds If the technology used has fast circuits, the partition of the period could be more than 6 portions of smaller weight and with smaller delay selection accordingly.

Bulk Delay Selection

Figure 10:
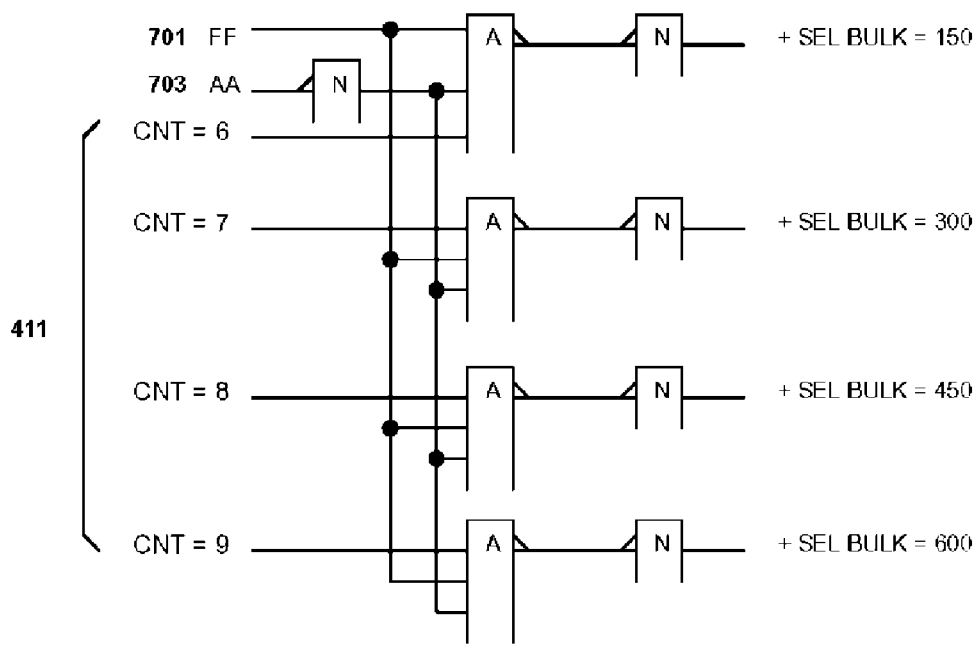
FIG. 10 depicts a decoder having inputs from the decoders of FIG. 4 and the latches of FIG. 7 used to select the proper BULK delay to be inserted into the ring oscillator loop.

For every full period count above 4, a total BULK delay of 150 picoseconds is selected for our example used herein. This number applies to one half period of the base ring clock. It must be multiplied by 2 and then added to the base clock period of 600 picoseconds. The new base clock period will be 600+150=750 picoseconds. Bulk delays of FIG. 3 could be arranged in other values instead of 50 picoseconds sections. A typical selection for BULK delay per full base clock period measured is shown In FIG. 10. The decoded counter value and the incremental latches F and A of FIG. 7 will determine the value of the BULK delay to be inserted into the loop. Any delay inserted into the loop will affect each half period of the base oscillator.

Fine Delay Selection

Once the BULK delay is selected, there is additional incremental delay to be selected based on the decoded incremental latches of FIG. 7 for finer adjustment of the ring oscillator frequency in order to produce the 1×CK INT 801 equal, or close to equal, to the 1×CLK 400 frequency.

Figure 9:
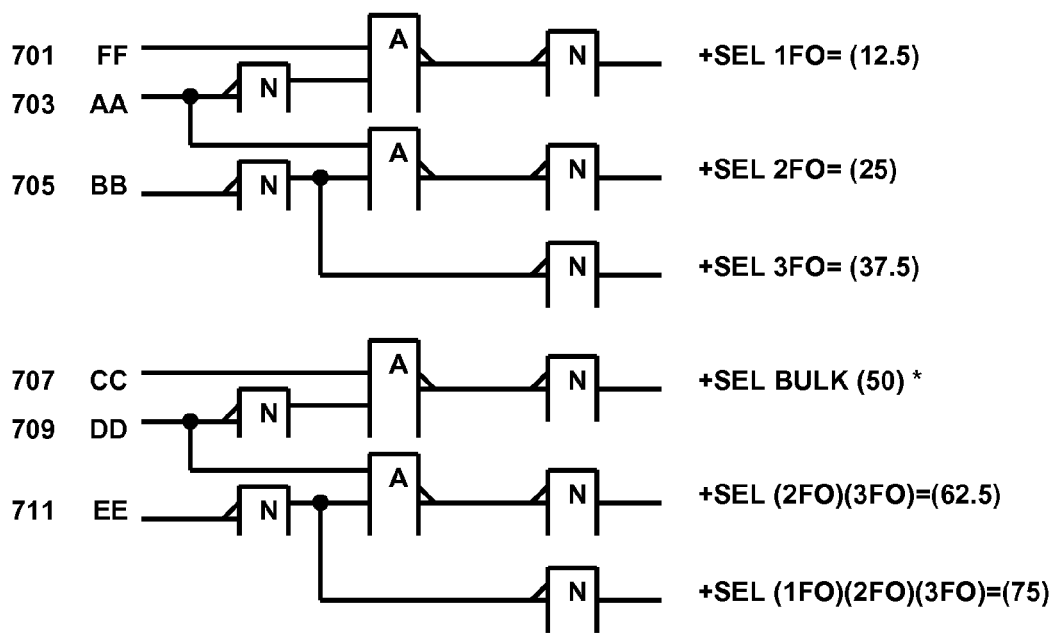
FIG. 9 depicts two digital circuits used to decode the S/R latches set in FIG. 7.

Decoding of the incremental latches and Incremental delay selection is shown in FIG. 9. The incremental delays are shown in 211, 212 and 213 of FIG. 2 as numeric values and as Fan Outs (FO).

After the BULK and the incremental latch delay selection, there is additional delay to be added to the loop. This delay is to account for the initial offset 500, as shown in FIG. 5, which is assumed to be 100 picoseconds, as well as the inaccuracy of the delays in the BULK delay tree of FIG. 3, the inaccuracy due to process, voltage and temperature variations and the inaccuracy of the speed of the incremental latch setting.

After this initial BULK and incremental delay selection, the loop is adjusted to produce the 1×CK INT 801 and INT CLK PERIOD 805. The relationship of these signals and the phase shifted signals derived from the circuit of FIG. 8 are shown in FIG. 8a. Another signal produced is an early 1×CK INT 806 to be used for phase synchronization with the 1×CLK IN of FIG. 4.

Figure 8B:
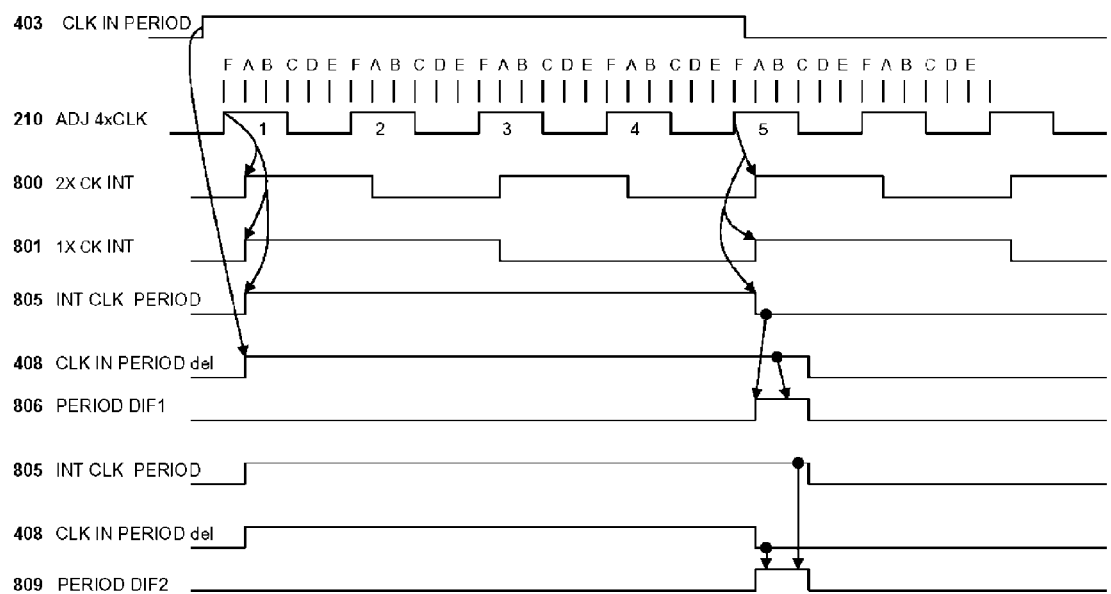
FIG. 8b depicts a timing diagram showing the signal produced by the circuit of FIG. 8, together with signals 408 and 805.

Referring now to FIG. 4, the CLK IN PERIOD 403 signal goes through a delay so that the phase of the CLK IN PERIOD del 408 signal co-insides with the phase of the INT CLK PERIOD 805 signal. This is shown in timing diagram of FIG. 8b.

Figure 8C:
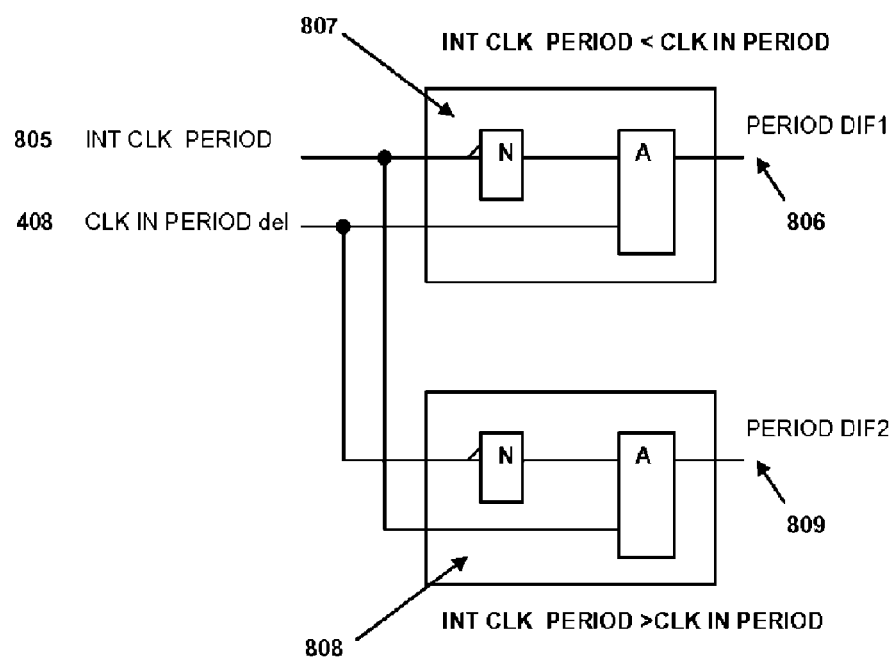
FIG. 8c depicts two digital circuits used for comparison of two signals which produce a pulse for time measurement of the phase difference between the two signals.

Then INT CLK PERIOD 805 and CLK IN PERIOD del 408 are compared in circuits 807 and 808 of FIG. 8c. Each of the circuits 807 and 808 will produce a pulse whose width is the difference in time between the two periods. Then pulse PERIOD DIF1 806 and PERIOD DIF2 809 are applied to fine delay calculation circuits shown in FIG. 8d.

Each latch when set will represent a delay adjustment to be made to the delay of the loop. The weight of each latch will be 100 picoseconds and in loop delay adjustment 12.5 picoseconds. Latch A 811 and latch B 812 of FIG. 8d will add the appropriate delay to the loop to expand the period duration. Latch A 812 and latch B 813 of FIG. 8d will subtract the appropriate delay from the loop to shorten the period duration.

Figure 8D:
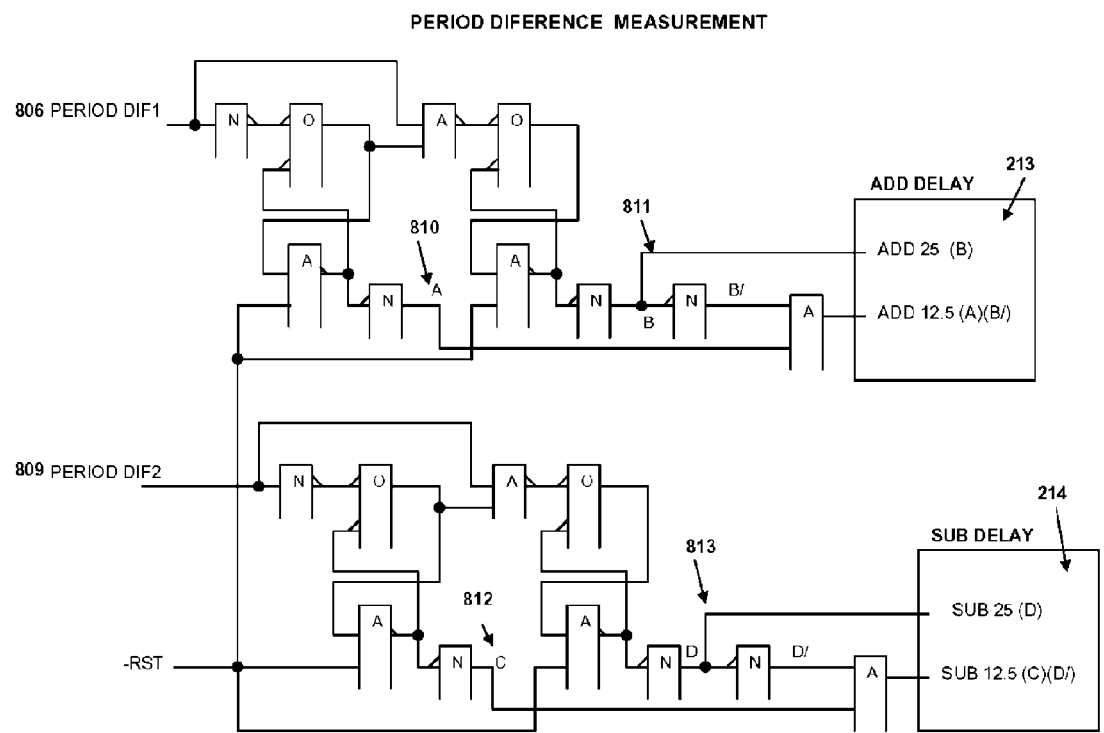
FIG. 8d depicts a collection of Set/Rest latches used to measure duration of the pulse generated by the circuits of FIG. 8c.

The number of latching elements shown in FIG. 8d could be increased, if necessary, to cover wider range of pulse widths. Furthermore, It is desirable to have the latching elements of FIG. 8d capable of resolving finer than 100 picoseconds intervals for more refined loop delay adjustment.

Period Equalization of 1×CLK 400 to 1×CK INT 801

Figure 11:
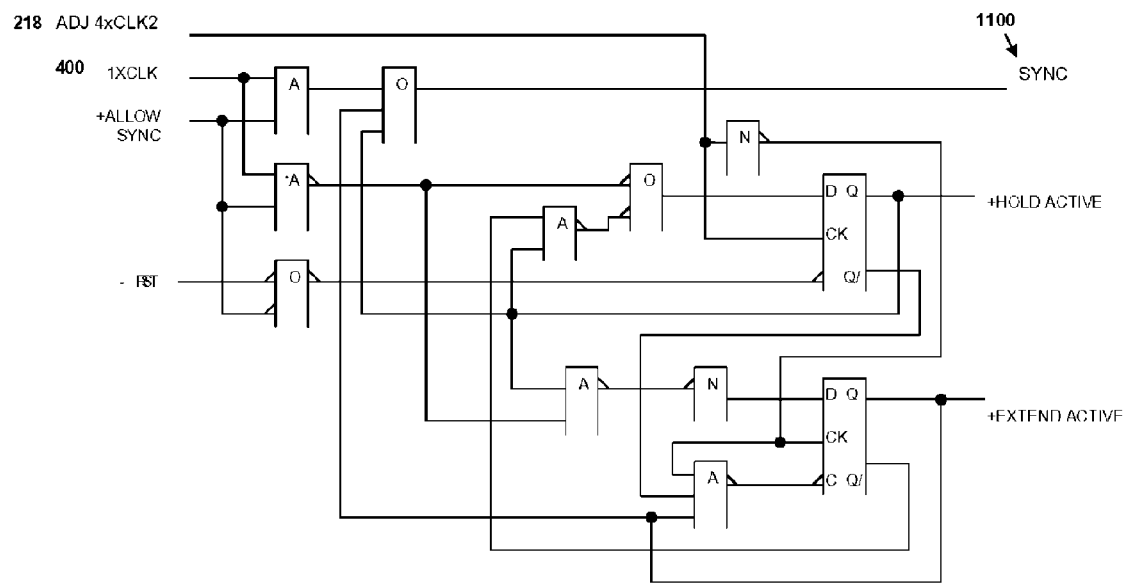
FIG. 11 depicts a circuits used to generate the SYNC pulse from the incoming 1×CLK frequency.

After the BULK and incremental delays are applied to the loop, the ring loop period will be shorter than ideal. Therefore, the INT CLK PERIOD 802 will be shorter than the CLK IN PERIOD 403. In order to correct that situation, the circuit of FIG. 11 is designed to provide a SYNC 1100 pulse shown in FIG. 11a. If the 1×CLK 400 is used to start the ring oscillator and some other means exist to maintain the oscillations, the INT CLK PERIOD 802 will continue to be shorter than CLK IN PERIOD 403 and, therefore, the oscillator will stay out of synchronization in the long run. What is needed is a restarting of the oscillator every time with the rising edge of the 1×CLK or with a signal that is produced with the rising edge of 1×CLK. A signal is required to stop the oscillator from producing its rising edge before the rise of the 1×CLK signal and allow it to restart with the 1×CLK rising edge. This signal is the SYNC 1100 and its duration shown in FIG. 11a. The Lo level of the SYNC will stop the oscillator from continuing and will restart it with its rising edge. If such control did not exist, the oscillator will go out of synchronization with the 1×CLK.

Figure 11A:
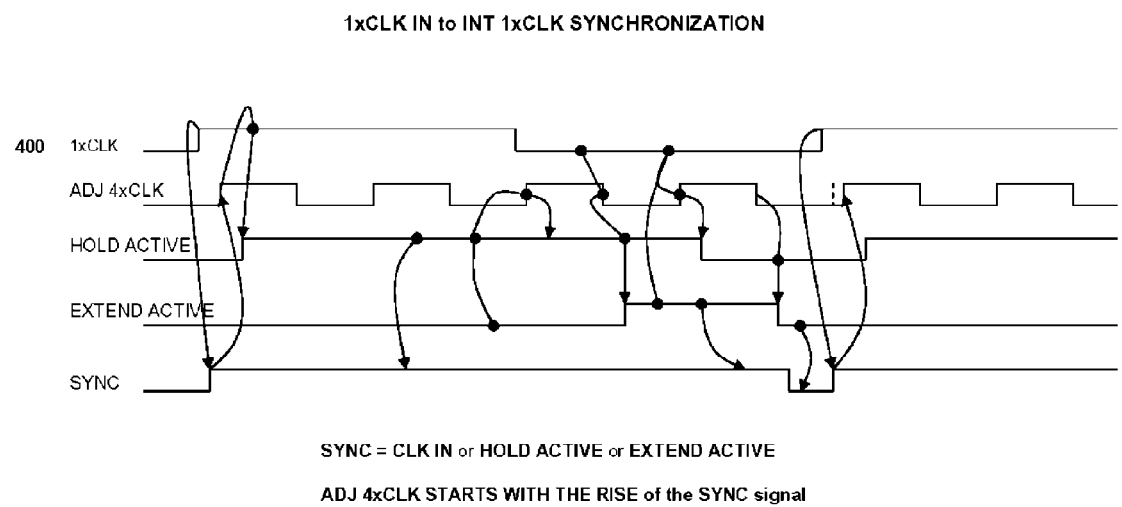
FIG. 11a depicts a timing diagram, showing the relationship of the SYNC pulse to the first 4×CLK rising edge of the circuit of FIG. 11.

FIG. 11a shows the timing relationships of signals produced by the circuit of FIG. 11.

Figure 12:
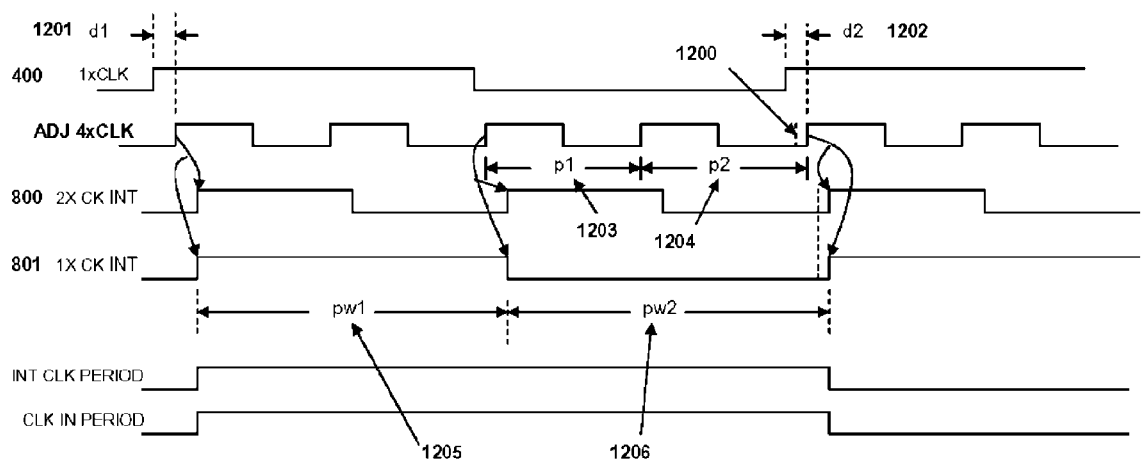
FIG. 12 depicts a timing diagram showing width of the unadjusted p1 and the adjusted p2 period widths of signals ADJ 4×CLK, as well as signal 1×CK INT.

Referring now to FIG. 12, it is assumed that the rising edge of 1×CLK, through indirect control, produces the first rising edge of the ADJ 4×CLK after delay 1201 d1. If the oscillator were free running, at point 1200 would have transitioned. Because the 1×CLK signal is low and controls the next rising edge transition of the 4×CLK, the transition will not occur until d2 1202 delay has expired. This will make the low duty cycle of 4×CLK longer and period p2 1204 longer than p1 1203 and pw2 1206 longer than pw1 1205. However, the INT CLK PERIOD 802 will equal the CLK IN PERIOD 403 in duration. Calculation would show that the asymmetry of the 1×CK INT 801 is within acceptable numbers.

Referring now to FIG. 8, an EARLY 1×CK INT 806 was generated and its timing is shown in FIG. 8a. The period of this signal is going to follow the same effects as is the period of 1×CK INT. If this early signal is fed to an output and then returned as an input signal, it can be compared to the 1×CLK 400. The phase difference can be determined by circuits similar to 8c and 8d to resolve and apply the correct delay to bring it in phase synchronization with the 1×CLK 400. Similarly, internal signals could be produced and synchronized with 1×CLK 400.

It will be apparent that improvements and modifications may be made within the purview of the invention without departing from the scope of the invention defined in the appended claims.

The invention claimed is:

1. A high frequency digital oscillator synchronized to a low frequency oscillator signal $s_{in}$ having a frequency $f_{in}$ and gated by the rising edge of signal $s_{in}$, the oscillator comprising:
 a) a ring oscillator having an odd number of digital gates and an adjustable feedback loop, the ring oscillator having a signal $s_{osc}$ with a frequency $f_{osc}$, and the ring oscillator comprising:
  i) a starting ring oscillator frequency approximately equal to a multiple $2^n$ (where n=1, 2, 3, etc.) of the synchronizing frequency $f_{in}$ of signal $s_{in}$;
  ii) an ability to fine adjust its frequency $f_{osc}$ so that it becomes an equal multiple $2^n$ of the synchronizing signal frequency $f_{in}$;
  iii) an output whose rising edge of signal $s_{osc}$ when first triggered by signal $s_{in}$ is in phase with the rising edge of said trigger;
  iv) control signal means to trigger the ring oscillator with every rising edge of $s_{in}$;
  v) control signal means to sustain oscillations of the ring oscillator for a minimum of a single period signal of $s_{in}$; and
  vi) means for maintaining the ring oscillator output $s_{osc}$ at a low level before the first rising edge of $s_{in}$ occurs and retaining $s_{osc}$ to said low level until the next rising edge of signal $s_{in}$;
 b) a multiplicity of signals $s_{x2}$, $s_{X4}$, $s_{X8}$, etc., derived by digitally dividing signal $s_{osc}$ and said signals having periods equal to 2, 4, 8, etc. times the period of the oscillator signal $s_{osc}$;
 c) means for selecting the one signal $s_{xsel}$ of said multiplicity of signals whose period is approximately equal to the period $p_{in}$ of signal $s_{in}$;
 d) means for measuring the integral number k of periods $p_{osc}$ that fit within one period $p_{in}$;
 e) means of determining the delta $\Delta = p_{in} - k*p_{osc}$; and
 f) means for using the resulting delta $\Delta$ to adjust the frequency of $f_{osc}$ so that period $p_{in}$=the period of $s_{xsel}$=$p_{sxel}$,
  wherein the means for measuring the incoming clock $P_{in}$ period further comprises a counter that measures the largest integral number of unadjusted ring oscillator periods $P_{osc}$ that fit within the $P_{in}$ said counter being stepped by every rising edge of signal $S_{ase}$, and
  wherein the means for counting periods $P_{osc}$ and generating a counter signal $S_{cntr}$ further comprises a counter circuit, and
  wherein the means for changing a loop delay $d_{loop}$ between the output of the ring oscillator and its input further comprises a delay adder which adds the delay $\Delta$ to $d_{loop}$, thus generating the $d_{crs}$ coarse delay signal, and
  wherein the means for measuring the delay $\Delta$ comprises a counter, and further comprises a multiplicity of time delay circuits disposed in series and each having a precise time delay period $t_d$ which is activated during the duration of time $\Delta$.

2. The oscillator of claim 1, wherein the time delay circuits further comprise latching circuits.

3. The oscillator of claim 2, wherein the means for making a fine adjustment to the loop delay comprises means for generating a new delay equal to $k*\Delta_1$, where k equal the number of latching circuits required, and $\Delta_1$ equals the delay of each latching circuit.

4. The oscillator of claim 3, further comprising means for inserting a new fine delay into the oscillator feedback loop.

5. The oscillator of claim 4, further comprising means for choosing a new output period of signal $s_{xsel}$, means for comparing said new output period to the period $p_{in}$, and means for making a new adjustment in the feedback loop as determined by the comparison.

* * * * *